(12) United States Patent
Park et al.

(10) Patent No.: US 9,019,773 B2
(45) Date of Patent: Apr. 28, 2015

(54) NONVOLATILE MEMORY DEVICE AND METHOD OF OPERATING THE SAME

(71) Applicant: Samsung Electronics Co., Ltd., Suwon-si, Gyeonggi-do (KR)

(72) Inventors: Il Han Park, Suwon-si (KR); Seung-Bum Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/037,582

(22) Filed: Sep. 26, 2013

(65) Prior Publication Data

US 2014/0119139 A1    May 1, 2014

(30) Foreign Application Priority Data

Nov. 1, 2012    (KR) .......................... 10-2012-0122985

(51) Int. Cl.
*G11C 16/04*    (2006.01)
*G11C 16/06*    (2006.01)
*G11C 16/34*    (2006.01)
*G11C 11/56*    (2006.01)

(52) U.S. Cl.
CPC ........ *G11C 16/3445* (2013.01); *G11C 16/3436* (2013.01); *G11C 16/344* (2013.01); *G11C 11/5635* (2013.01); *G11C 16/0483* (2013.01)

(58) Field of Classification Search
CPC ................................ G11C 16/04; G11C 16/06
USPC .................................................. 365/185.22
See application file for complete search history.

(56) References Cited

U.S. PATENT DOCUMENTS

| 6,381,670 | B1 * | 4/2002 | Lee et al. ....................... 711/103 |
| 7,835,190 | B2 * | 11/2010 | Sarin et al. ................ 365/185.22 |
| 7,983,090 | B2 | 7/2011 | Aritome |
| 8,018,774 | B2 * | 9/2011 | Hwang et al. ............. 365/185.22 |
| 8,446,777 | B2 * | 5/2013 | Ueno et al. ................ 365/185.24 |
| 8,687,419 | B2 * | 4/2014 | Park ......................... 365/185.03 |
| 2003/0076710 | A1 | 4/2003 | Sofer et al. |
| 2007/0047327 | A1 * | 3/2007 | Goda et al. ................ 365/185.29 |
| 2008/0019182 | A1 | 1/2008 | Yanagidaira et al. |
| 2011/0013460 | A1 | 1/2011 | Dong et al. |
| 2012/0033503 | A1 | 2/2012 | Kim et al. |
| 2012/0206972 | A1 * | 8/2012 | Shiino et al. ............. 365/185.19 |
| 2012/0206975 | A1 * | 8/2012 | Yang ......................... 365/185.22 |
| 2014/0003156 | A1 * | 1/2014 | He ............................ 365/185.22 |

FOREIGN PATENT DOCUMENTS

KR    10-2011-0065759 A    6/2011
KR    10-2012-0021569 A    3/2012

* cited by examiner

*Primary Examiner* — Son Mai
(74) *Attorney, Agent, or Firm* — Volentine & Whitt, PLLC

(57) ABSTRACT

A nonvolatile memory device includes a memory cell array and control logic. The memory cell array includes multiple memory blocks, each memory block including memory cells connected to word lines and bit lines. The control logic is configured to perform an erase operation in which an erase voltage is applied to a memory block of the multiple memory blocks to erase the memory cells of the memory block, and in which an erase verification voltage is applied a selected word line of the memory block to verify respective erase states of memory cells connected to the selected word line. The control logic is further configured to apply a read voltage to the selected word line to extract erase state information of the memory cells, and to control a level of the erase verification voltage based on the erase state information.

15 Claims, 15 Drawing Sheets

Fig. 13

| PE Cycle | 1K | 10K | 100K | 1000K | 10000K | ... |
|---|---|---|---|---|---|---|
| Erase Verify Level | 1 | 1.2 | 1.3 | 1.1 | 0.7 | ... |

NONVOLATILE MEMORY DEVICE AND METHOD OF OPERATING THE SAME

CROSS-REFERENCE TO RELATED APPLICATIONS

A claim for priority under 35 U.S.C. §119 is made to Korean Patent Application No. 10-2012-0122985, filed Nov. 1, 2012, in the Korean Intellectual Property Office, the entire contents of which are hereby incorporated by reference.

BACKGROUND

The inventive concepts described herein relate to a semiconductor memory device, and more particularly, relate to a nonvolatile memory device and an operating method thereof.

A semiconductor memory device is fabricated using semiconductor materials, such as silicon (Si), germanium (Ge), gallium arsenide (GaAs), indium phosphide (InP), and so on. Semiconductor memory devices are classified as volatile memory devices or nonvolatile memory devices.

Generally, volatile memory devices lose stored contents at power-off. Examples of volatile memory devices include random access memory (RAM), static RAM (SRAM), dynamic RAM (DRAM), synchronous DRAM (SDRAM), and the like. Nonvolatile memory devices retain stored contents even at power-off. Examples of nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

As a nonvolatile memory device, program and erase operations of a flash memory device, for example, may be performed to vary a threshold voltage of a memory cell. As electrons are moved by a strong electric field applied to a thin oxide film, the threshold voltage of the memory cell may be varied. As the number of program and erase operations of the flash memory device increases, electrons may be trapped by the thin oxide film. This may cause an increase in the threshold voltage of the memory cell. Thus, the number of fail bits indicating that data is not erased in an erase operation may increase, deteriorating reliability.

SUMMARY

One aspect of the inventive concept is directed to a nonvolatile memory device that includes a memory cell array and control logic. The memory cell array includes multiple memory blocks, each memory block including memory cells connected to word lines and bit lines. The control logic is configured to perform an erase operation in which an erase voltage is applied to a memory block of the multiple memory blocks to erase the memory cells of the memory block, and in which an erase verification voltage is applied a selected word line of the memory block to verify respective erase states of memory cells connected to the selected word line. The control logic is further configured to apply a read voltage to the selected word line to extract erase state information of the memory cells, and to control a level of the erase verification voltage based on the erase state information.

The erase state information may indicate the number of on-cells or off-cells of the memory cells connected to the selected word line.

The control logic may be further configured to decrease the level of the erase verification voltage when the number of on-cells is less than a first reference value. The control logic may be further configured to increase the level of the erase verification voltage when the number of on-cells is more than a second reference value, the second reference value being larger than the first reference value.

The control logic may be further configured to control the first reference value and the second reference value according to a measured temperature. The control logic may be further configured to decrease the first reference value and the second reference value when the measured temperature is greater than a reference temperature, and to increase the first reference value and the second reference value when the measured temperature is less than the reference temperature.

The control logic may be further configured to control the first reference value and the second reference value according to the number of erase operations executed. The control logic may be further configured to decrease the first reference value and the second reference value when the number of erase operations executed increases.

The erase voltage may include an initial erase voltage and an erase voltage increment, and the control logic may be further configured to control a level of the initial erase voltage and a level of the erase voltage increment.

The control logic may be further configured to control the level of the initial erase voltage according to a variation in the level of the erase verification voltage. The control logic may be further configured to control the level of the erase voltage increment based on the erase state information.

Another aspect of the inventive concept is directed to a method of operation a a nonvolatile memory device. The method includes performing an erase operation in which an erase voltage is applied to a memory block to erase memory cells and an erase verification voltage is applied to a selected word line to verify an erase state of memory cells connected to the selected word line; applying a read voltage to the selected word line to determine the number of on-cells; and controlling a level of the erase verification voltage such that the number of on-cells is maintained within a range defined by a first reference value and a second reference value.

The level of the erase verification voltage may decrease when the number of on-cells is less than the first reference value and increase when the number of on-cells is more than the second reference value. The second reference value is larger than the first reference value.

The method may further include controlling a level of the erase voltage based on the level of the erase verification voltage, the erase voltage including an initial erase voltage and an erase voltage increment.

Controlling the level of the erase verification voltage may include measuring a temperature of the nonvolatile memory device, and controlling the first reference value and the second reference value according to the measured temperature. The first reference value and the second reference value may decrease when the measured temperature is greater than a reference temperature and increase when the measured temperature is less than the reference temperature.

Controlling the level of the erase verification voltage may include controlling the first reference value and the second reference value according to the number of program and erase operations executed. The first reference value and the second reference value may decrease according to an increase in the number of program and erase operations executed.

Still another aspect of the inventive concept is directed to a nonvolatile memory device that includes a memory cell array, control logic and a table. The memory cell array includes multiple memory blocks, each memory block comprising memory cells connected to word lines and bit lines. The control logic is configured to perform an erase operation in which an erase voltage is applied to a memory block of the multiple memory blocks to erase the corresponding memory cells, and an erase verification voltage is applied a selected word line of the memory block to verify erase state of the memory cells connected to the selected word line. The table is configured to store information indicating the number of erase operations and information indicating a level of the erase verification voltage corresponding to the information indicating the number of erase operation. The control logic is further configured to control the level of the erase verification voltage based on the table.

BRIEF DESCRIPTION OF THE FIGURES

The above and other objects and features will become apparent from the following description with reference to the following figures, in which like reference numerals refer to like parts throughout the various figures unless otherwise specified, and in which:

FIG. 13 is a table for describing an operation of a nonvolatile memory device of FIG. 12, according to an embodiment of the inventive concept;

DETAILED DESCRIPTION

Figure 1:
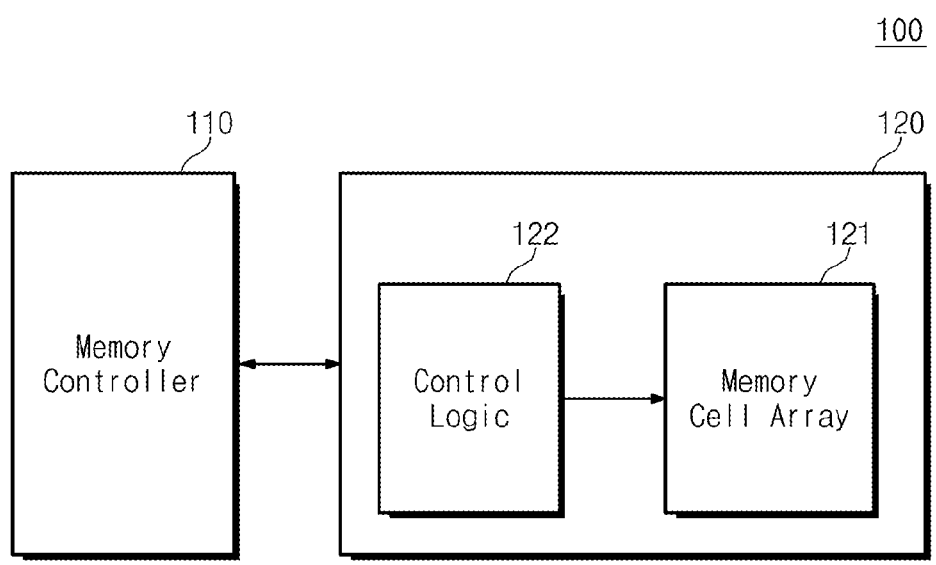
FIG. 1 is a block diagram schematically illustrating a memory system, according to an embodiment of the inventive concept.

Embodiments will be described in detail with reference to the following detailed description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to one of ordinary skill in the art. Accordingly, known processes, elements, and techniques may not be described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system, according to an embodiment of the inventive concept.

Referring to FIG. 1, a memory system 100 includes a memory controller 110 and a nonvolatile memory device 120. For purposes of illustration, it is assumed that the nonvolatile memory device 120 is a flash memory device. However, embodiments of the inventive concept are not limited thereto. For example, the spirit and scope of the inventive concept may be applied to nonvolatile memory devices such as a ROM device, a FROM device, an EPROM device, an EEPROM device, a PRAM device, an MRAM device, a FRAM device, a RRAM device, and the like. In this specification, the term "distribution" may be used to indicate the number of memory cells, corresponding to a threshold voltage, from among memory cells in a specific unit (e.g., a page, a block, a chip, etc.)

The memory controller 110 may be connected to a host (not shown) and the nonvolatile memory device 120. The memory controller 110 is configured to access the nonvolatile memory device 120 in response to a request from the host. For example, the memory controller 110 may be configured to control read, program, erase and background operations of the nonvolatile memory device 120.

The nonvolatile memory device 120 includes a memory cell array 121 and control logic 122. The memory cell array 121 may include memory cells disposed at intersections of word lines and bit lines. Each memory cell may store M-bit data (M being a natural number). A memory cell storing 1-bit data may be referred to as a single-level cell (SLC), and a memory cell storing two or more bits of data may be referred to as a multi-level cell (MLC).

The control logic 122 may operate responsive to control signals from the memory controller 110. The control logic 122 may control overall operation of the nonvolatile memory device 120. The control logic 122 may be configured to include a high voltage generator. For example, the control logic 122 may be configured to apply a program voltage to a selected word line for programming data in memory cells connected to the selected word line and to apply a program verification voltage to the selected word line for verifying of program states. The control logic 122 may apply a read voltage to the selected word line of the memory cell array 121 to read programmed data. Also, the control logic 122 may apply an erased voltage to a memory block of the memory cell array 121 for erasing of programmed data. The control logic 122 may apply an erase verification voltage to selected word line of the memory cell array 121 for verifying an erase state.

The nonvolatile memory device 120 may perform program and read operations by page and an erase operation by memory block. An erase operation on a memory block including a page to be programmed may be essential to program data in the page due to a characteristic of the nonvolatile memory device 120. That is, the nonvolatile memory device 120 may iteratively perform program and erase operations, which constitute a cycle. As program and erase operations are iterated, electrons may be trapped in memory cells, which may cause an increase in the threshold voltages of the memory cells. In the event that an erase operation is performed using a constant erase verification voltage, the number of fail bits indicating that data is not erased may increase. Thus, the reliability may be deteriorated.

With the nonvolatile memory device 120, erase state information of memory cells connected to a selected word line is determined using a read voltage applied to the selected word line, and the level of an erase verification voltage may be controlled based on the erase state information. The erase state information indicates the number of on-cells or off-cells of memory cells connected to the selected word line.

The nonvolatile memory device 120 may maintain the number of fail bits within a range, and thus the reliability of the nonvolatile memory device 120 may be maintained at a constant level. This means that the reliability of the nonvolatile memory device 120 improves. This will be more fully described with reference to FIGS. 2 to 11.

Figure 2:
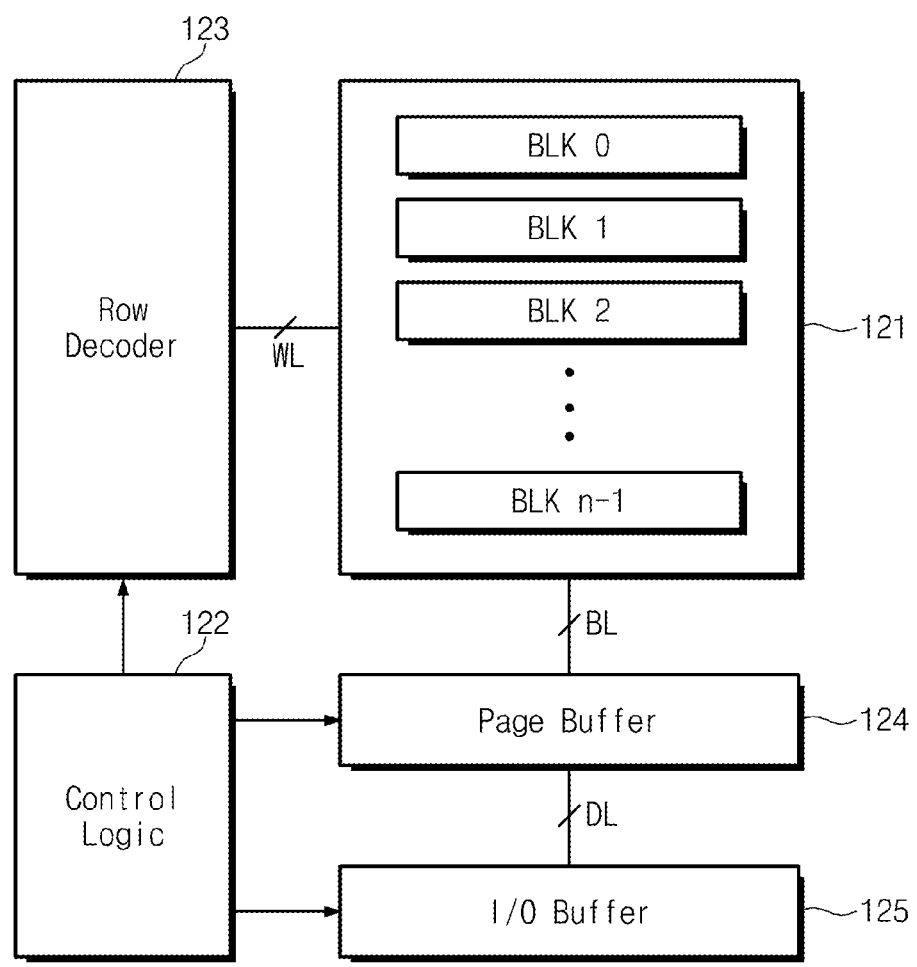
FIG. 2 is a block diagram schematically illustrating a nonvolatile memory device, according to an embodiment of the inventive concept.
Figure 3:
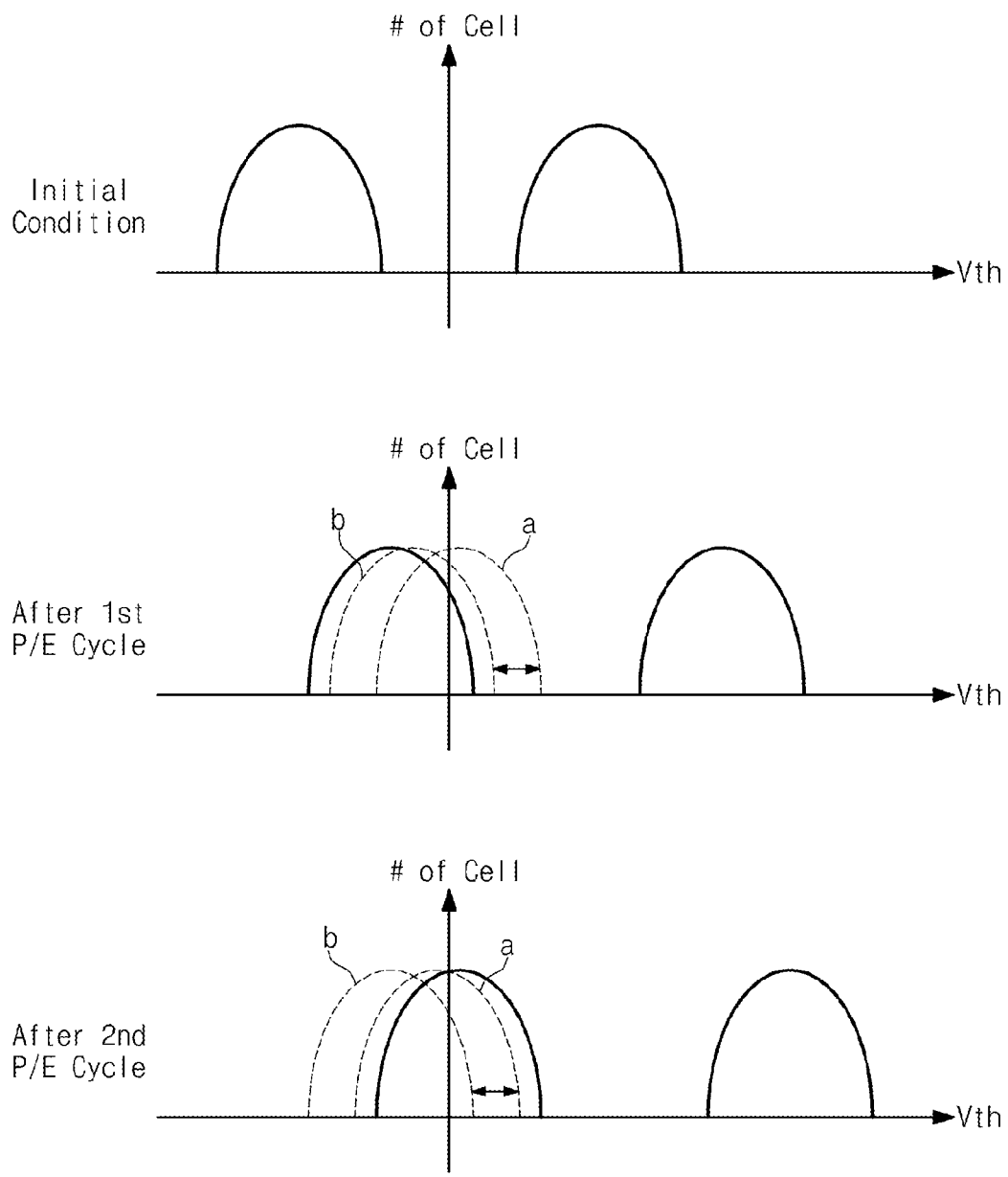
FIG. 3 is a diagram for describing an operation of control logic of FIG. 2, according to an embodiment of the inventive concept.
Figure 4:
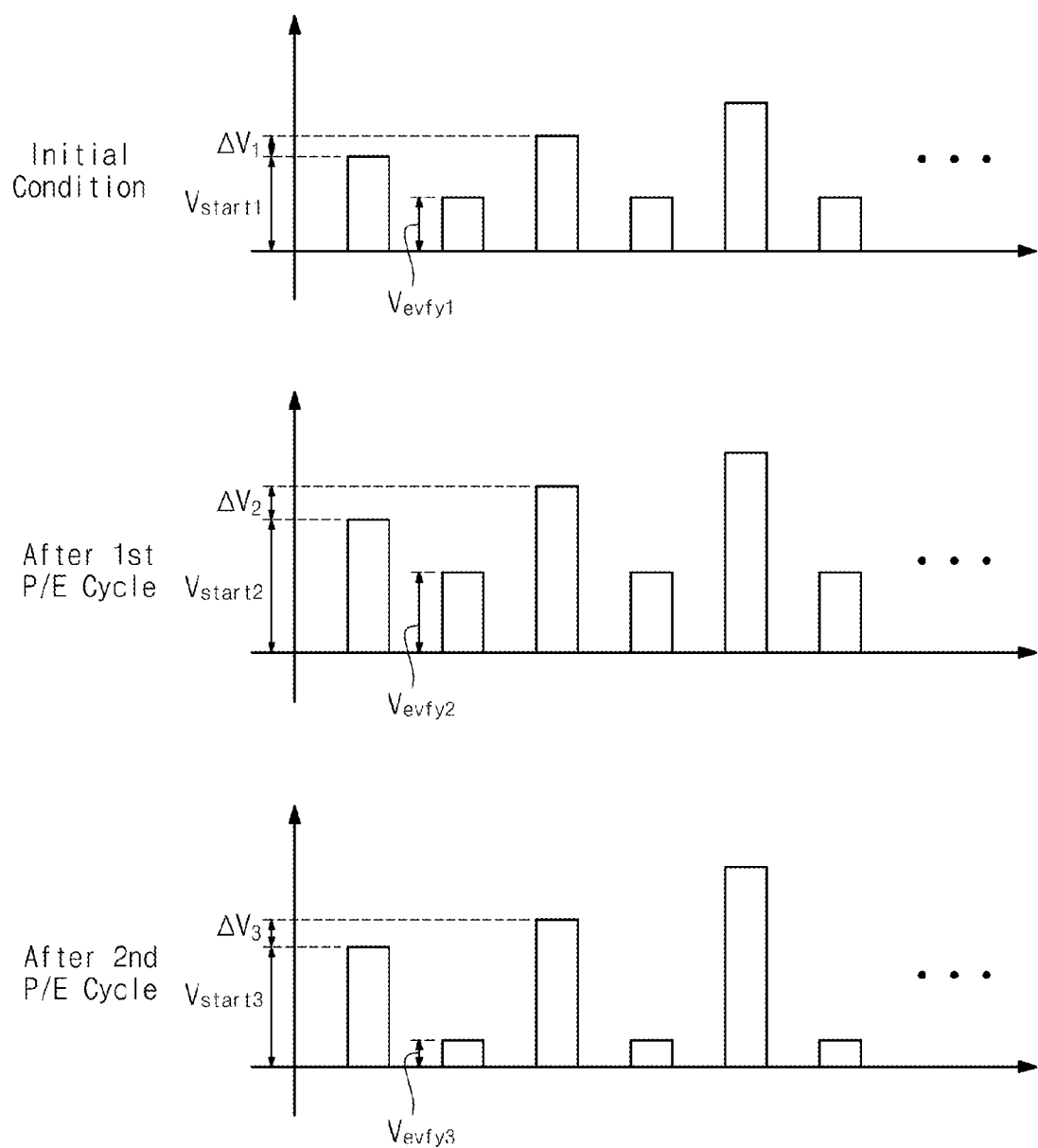
FIG. 4 shows an erase voltage and an erase verification voltage applied to a memory cell array according to an operation of control logic of FIG. 3, according to an embodiment of the inventive concept.
Figure 5:
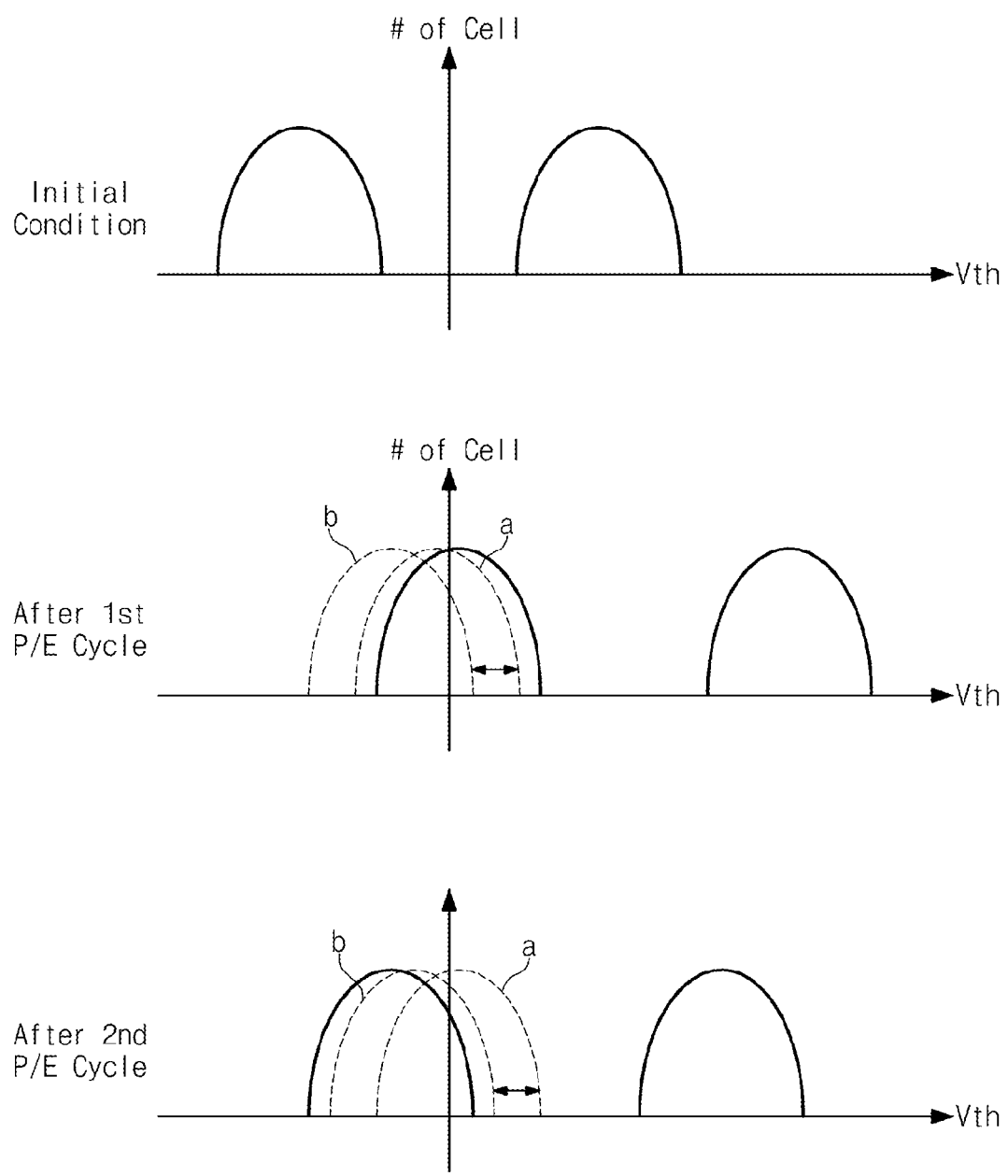
FIG. 5 is a diagram for describing another operation of control logic of FIG. 2, according to an embodiment of the inventive concept.
Figure 6:
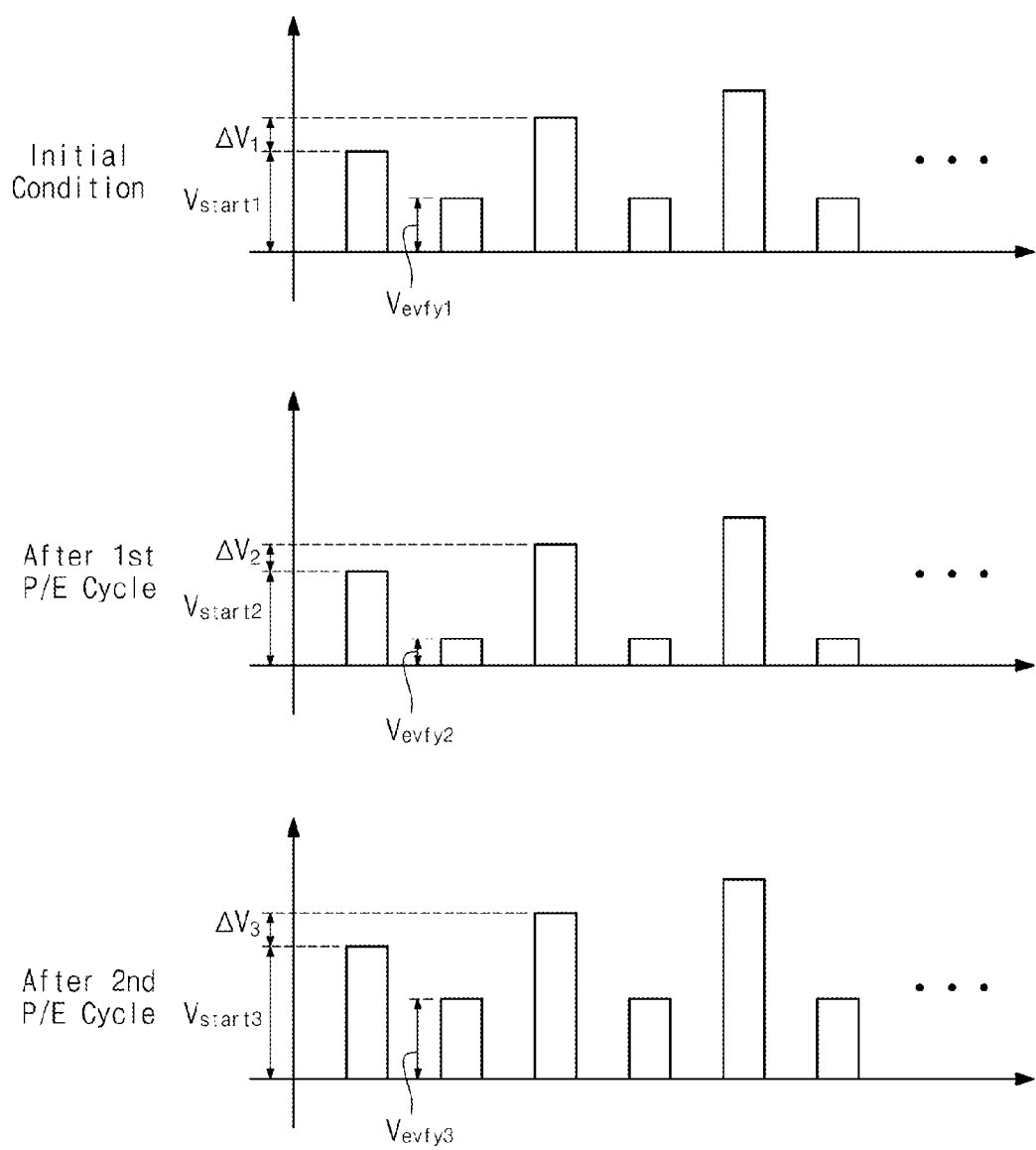
FIG. 6 shows an erase voltage and an erase verification voltage applied to a memory cell array according to an operation of control logic of FIG. 5, according to an embodiment of the inventive concept.

FIG. 2 is a block diagram schematically illustrating a nonvolatile memory device, according to an embodiment of the inventive concept. FIG. 3 is a diagram for describing an operation of control logic of FIG. 2, according to an embodiment of the inventive concept. FIG. 4 shows an erase voltage and an erase verification voltage applied to a memory cell array according to an operation of control logic of FIG. 3, according to an embodiment of the inventive concept. FIG. 5 is a diagram for describing another operation of control logic of FIG. 2, according to an embodiment of the inventive concept. FIG. 6 shows an erase voltage and an erase verification voltage applied to a memory cell array according to an operation of control logic of FIG. 5, according to an embodiment of the inventive concept. Below, an example is described in which erase state information means the number of on-cells.

Referring to FIG. 2, the nonvolatile memory device 120 according to an embodiment of the inventive concept includes a memory cell array 121, control logic 122, a row decoder 123, a page buffer circuit 124, and an input/output buffer 125.

The memory cell array 121 includes a plurality of memory blocks BLK0 to BLKn−1, each of which is formed of a plurality of pages. Each page includes a plurality of memory cells, each of which is disposed at an intersection of a word line and a bit line. It is assumed that each memory cell is a single-level cell (SLC). However, embodiments of the inventive concept may be applied to other types of memory cells, such as a multi-level cell (MLC), without departing from the spirit and scope of the present teachings.

The control logic 122 controls overall operations of the nonvolatile memory device 120. The control logic 122 may be configured to include a high voltage generator. That is, the control logic 122 may generate high voltages needed for program, read and erase operations in response to control signals from the memory controller 110 (refer to FIG. 1). For example, the control logic 122 may provide the memory cell array 121 with a program voltage, a verification voltage, a pass voltage through the row decoder 123.

Referring to FIG. 3, there are illustrated threshold voltage distributions of memory cells connected to a selected word line in an initial condition, after a first program/erase (P/E) cycle and after a second program/erase cycle. The initial condition of the threshold voltage distribution is illustrated for purposes of comparison. For example, the initial condition may be assumed not to include fail bits.

Referring to FIGS. 2 and 3, after a program/erase cycle, the control logic 122 applies a read voltage Vrd to the selected word line of the memory cell array 121 through the row decoder 123. In various embodiments, the read voltage Vrd is used to discriminate an erase state, for example. The control logic 122 determines the number of on-cells of memory cells connected to the selected word line through the read operation.

For example, the number of on-cells after the first program/ erase cycle may be less than that of the initial condition. The number of on-cells after the second program/erase cycle may be less than the number of on-cells after the first program/ erase cycle. As described above, the reason may be that the threshold voltage of a memory cell increases due to electrons trapped in the memory cell according to the iteration of program and erase operations. That is, the second program/erase cycle means more program/erase operations are performed compared with the first program/erase cycle.

Meanwhile, in an erase operation, the control logic 122 applies an erase voltage Verase to a memory block of the memory cells array 121 to be erased. The control logic 122 applies an erase verification voltage Vevfy to the selected word line of the memory cell array 121 through the row decoder 123. In the erase operation, the control logic 122 controls the erase verification voltage Vevfy such that the number of on-cells as determined by the read operation is maintained within a predetermined range. The predetermined range may be defined by a first reference value a and a second reference value b (a and b being natural numbers). The first reference value a may be smaller than the second reference value b.

In an embodiment, the control logic 122 decreases the erase verification voltage when the number of on-cells as determined is smaller than the first reference value a (e.g., as shown after the second program/erase cycle). The control logic 122 increases the erase verification voltage when the number of on-cells as determined is larger than the second reference value b (e.g., as shown after the first program/erase cycle). The number of on-cells may be maintained within the range defined by the first reference value a and the second reference value b by controlling the erase verification voltage through the control logic 122. In other words, it is understood that the number of fail bits is maintained within a constant range by controlling the erase verification voltage through the control logic 122.

Referring to FIG. 4, there is illustrated an erase voltage and an erase verification voltage applied to the memory cell array 121 for an erase operation of cycles after the first program/ erase cycle and the second program/erase cycle. An erase voltage and an erase verification voltage corresponding to an initial condition is illustrated for comparison with such cases.

First, an erase verification voltage Vevfy will be described. As described with reference to FIG. 3, the control logic 122 may decrease the erase verification voltage when the number of on-cells as determined is smaller than the first reference value a (e.g., as shown after the second program/erase cycle). That is, the control logic 122 may control the level of an erase verification voltage Vevfy3 after the second program/erase cycle to be less than the level of an erase verification voltage Vevfy2 after the first program/erase cycle.

The control logic 122 may increase the erase verification voltage when the number of on-cells as determined is larger than the second reference value b (e.g., as shown after the first program/erase cycle). That is, the control logic 122 may control the level of the erase verification voltage Vevfy2 after the first program/erase cycle to be greater than the level of an erase verification voltage Vevfy1 in the initial condition as well as greater than the level of the erase verification voltage Vevfy3 after the second program/erase cycle.

Next, an erase voltage Verase will be described. In an erase operation, the control logic 122 may apply an erase voltage to the memory block of the memory cell array 121 based on an incremental step pulse erasing (ISPE) technique. The erase voltage Verase may be formed by an initial erase voltage Vstart and an increment $\Delta V$, where the erase voltage Verase increases by the increment $\Delta V$ after the initial erase voltage Vstart is applied.

The control logic 122 may control the level of the initial erase voltage Vstart according to variation in the level of the erase verification voltage. The control logic 122 may control the level of the increment $\Delta V$ based on erase state information.

For example, the control logic 122 may control an initial erase voltage Vstart2 and an increment $\Delta V2$ in the erase operation after the first program/erase cycle to be greater than an initial erase voltage Vstart1 and an increment $\Delta V1$ in the erase operation of the initial condition, respectively. The control logic 122 may control an initial erase voltage Vstart3 and an increment $\Delta V3$ in the erase operation after the second program/erase cycle to be less than the initial erase voltage Vstart2 and the increment $\Delta V2$ in the erase operation after the first program/erase cycle, respectively. For example, the level of the initial erase voltage Vstart3 may be greater than the level of the initial erase voltage Vstart1 and less than the level of the initial erase voltage Vstart2. The level of the increment $\Delta V3$ may be greater than the level of the increment $\Delta V1$ and less than the level of the increment $\Delta V2$.

Referring to FIG. 5, there is illustrated a case in which the number of on-cells after the second program/erase cycle is more than the number of on-cells after the first program/erase cycle.

In an erase operation, the control logic 122 controls the erase verification voltage such that the number of on-cells determined through a read operation is maintained within a predetermined range. The predetermined range is defined by the first reference value a and the second reference value b (a and b being natural numbers). The first reference value a may be smaller than the second reference value b.

The control logic 122 may decrease the erase verification voltage when the number of on-cells as determined is smaller than the first reference value a (e.g., as shown after the first program/erase cycle). The control logic 122 may increase the erase verification voltage when the number of on-cells as determined is larger than the second reference value b (e.g., as shown after the second program/erase cycle). The number of on-cells may be maintained within the range defined by the first reference value a and the second reference value b by controlling the erase verification voltage through the control logic 122. In other words, it is understood that the number of fail bits is maintained within a constant range by controlling the erase verification voltage through the control logic 122.

Referring to FIG. 6, there is illustrated an erase voltage and an erase verification voltage applied to the memory cell array 121 for an erase operation of cycles after the first and second program/erase cycles. An erase voltage and an erase verification voltage corresponding to an initial condition is illustrated for comparison with such cases.

First, an erase verification voltage Vevfy will be described. As described with reference to FIG. 5, the control logic 122 may decrease the erase verification voltage when the number of on-cells as determined is smaller than the first reference value a (e.g., after the first program/erase cycle). That is, the control logic 122 may control the level of the erase verification voltage Vevfy2 after the first program/erase cycle to be less than a level of the erase verification voltage Vevfy1 corresponding to the initial condition.

The control logic 122 may increase the erase verification voltage when the number of on-cells as determined is larger than the second reference value b (e.g., as shown after the second program/erase cycle). That is, the control logic 122 may control the level of the erase verification voltage Vevfy3 after the second program/erase cycle to be greater than the level of the erase verification voltage Vevfy2 after the first program/erase cycle, and greater than the level of the erase verification voltage Vevfy1 in the initial condition.

Next, an erase voltage Verase will be described. In an erase operation, the control logic 122 may apply an erase voltage to a memory block of the memory cell array 121 based on an incremental step pulse erasing (ISPE) technique.

The control logic 122 may control the level of an initial erase voltage Vstart according to variation in the level of the erase verification voltage. The control logic 122 may control the level of an increment ΔV based on erase state information.

For example, the control logic 122 may control the initial erase voltage Vstart2 and the increment ΔV2 in the erase operation after the first program/erase cycle to be less than the initial erase voltage Vstart1 and the increment ΔV1 in the erase operation of the initial condition, respectively. The control logic 122 may control the initial erase voltage Vstart3 and the increment ΔV3 in the erase operation after the second program/erase cycle to be greater than the initial erase voltage Vstart2 and the increment ΔV2 in the erase operation after the first program/erase cycle, respectively. For example, the level of the initial erase voltage Vstart1 may be greater than the level of the initial erase voltage Vstart2 and less than the level of the initial erase voltage Vstart3. The level of the increment ΔV1 may be greater than the level of the increment ΔV2 and less than the level of the increment ΔV3.

Returning to FIG. 2, the row decoder 123 selects a word line in response to a page address. The row decoder 123 transfers a word line voltage provided from the control logic 122 to the selected word line.

The page buffer circuit 124 may operate as a write driver or a sense amplifier according to a mode of operation. For example, at a read operation, the page buffer circuit 124 may operate as a sense amplifier. At the read operation, the page buffer circuit 124 may be provided with a page of data from the memory cell array 121. For example, the memory cell array 121 may be provided with a page of LSB data or MSB data corresponding to a page address from the memory cell array 121.

The input/output buffer 125 may be configured to exchange data with an external device. Data received from the external device may be transferred to the page buffer circuit 124 through data lines DL. Data transferred from the page buffer circuit 124 may be output to the external device. For example, input/output buffer 125 may include well-known components such as a data buffer and so on.

Figure 7:
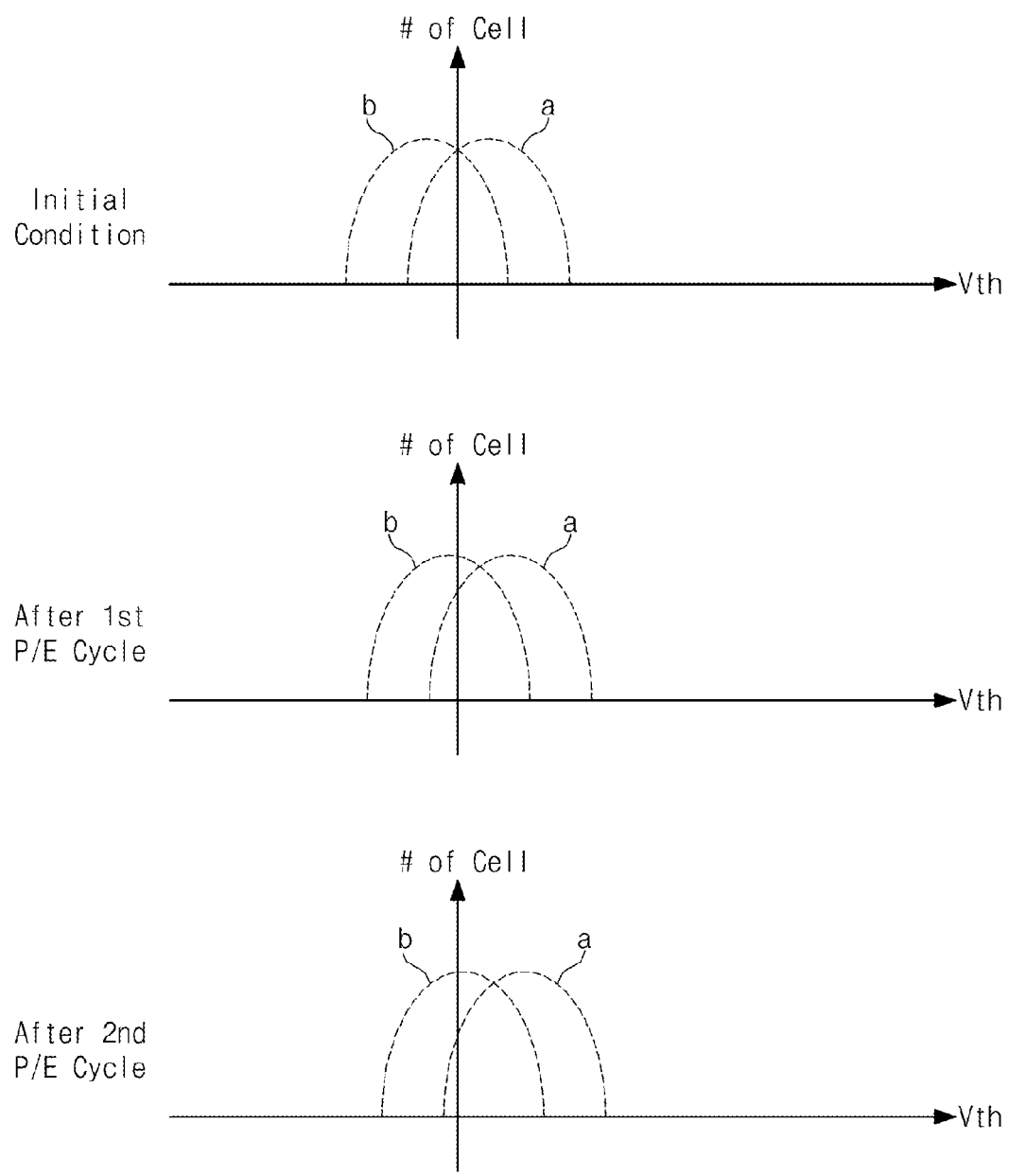
FIG. 7 is a diagram for describing an operation of control logic controlling a first reference value and a second reference value, according to an embodiment of the inventive concept.

FIG. 7 is a diagram for describing an operation of control logic controlling a first reference value and a second reference value.

In FIG. 7, there is illustrated a diagram for describing operation of control logic to control a first reference value a and a second reference value b according to the number of program/erase cycles, according to an embodiment of the inventive concept.

Referring to FIG. 7, as the number of program/erase cycles increases, the control logic 122 (refer to FIG. 2) decreases the first reference value a and the second reference value b. That is, the first reference value a and the second reference value b after a first program/erase cycle is smaller than the first reference value a and the second reference value b of the initial condition. Also, the first reference value a and the second reference value b after the second program/erase cycle is smaller than the first reference value a and the second reference value b after the first program/erase cycle. This may compensate for variation in threshold voltages of memory cells due to an increase in the number of program/erase cycles.

Figure 8:
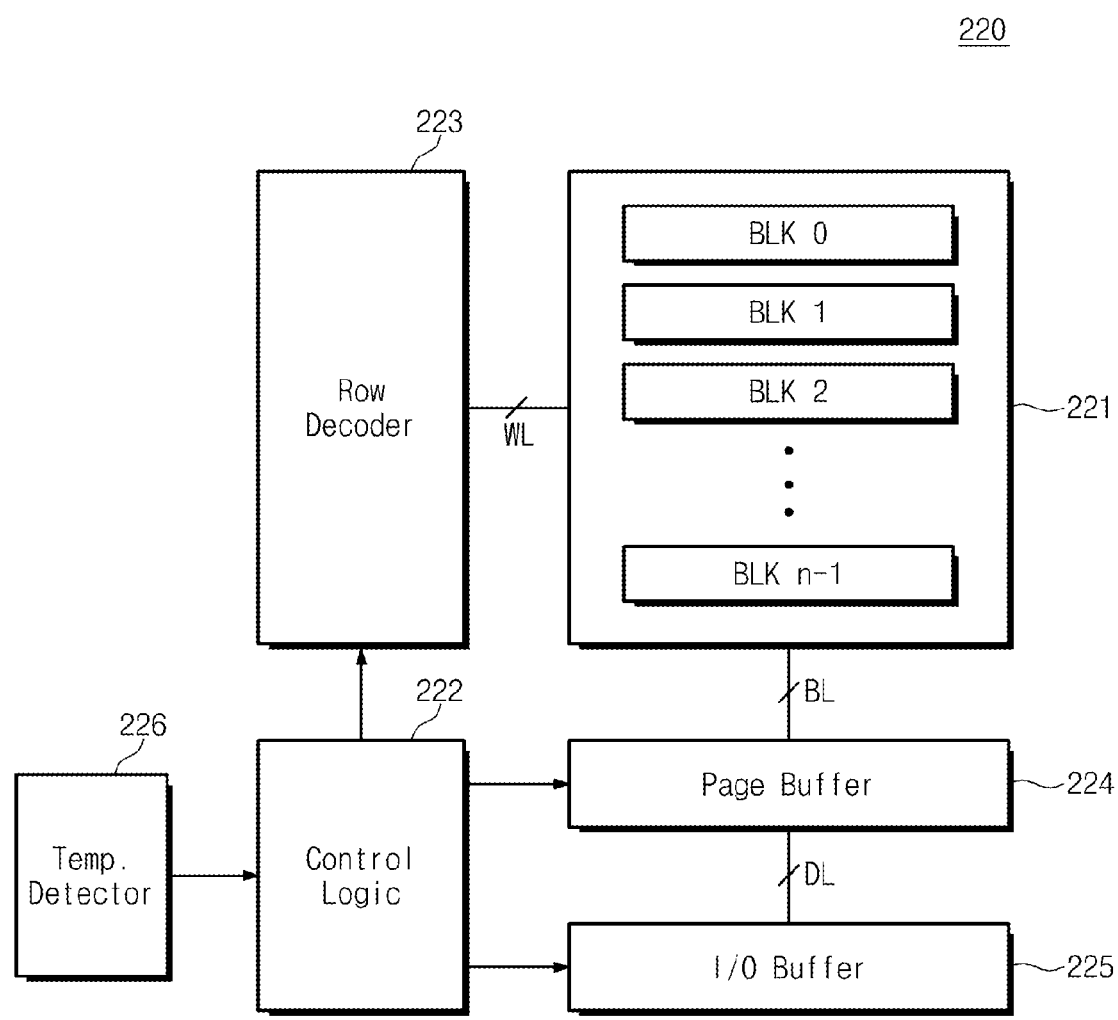
FIG. 8 is a block diagram schematically illustrating a nonvolatile memory device, according to another embodiment of the inventive concept.
Figure 9:
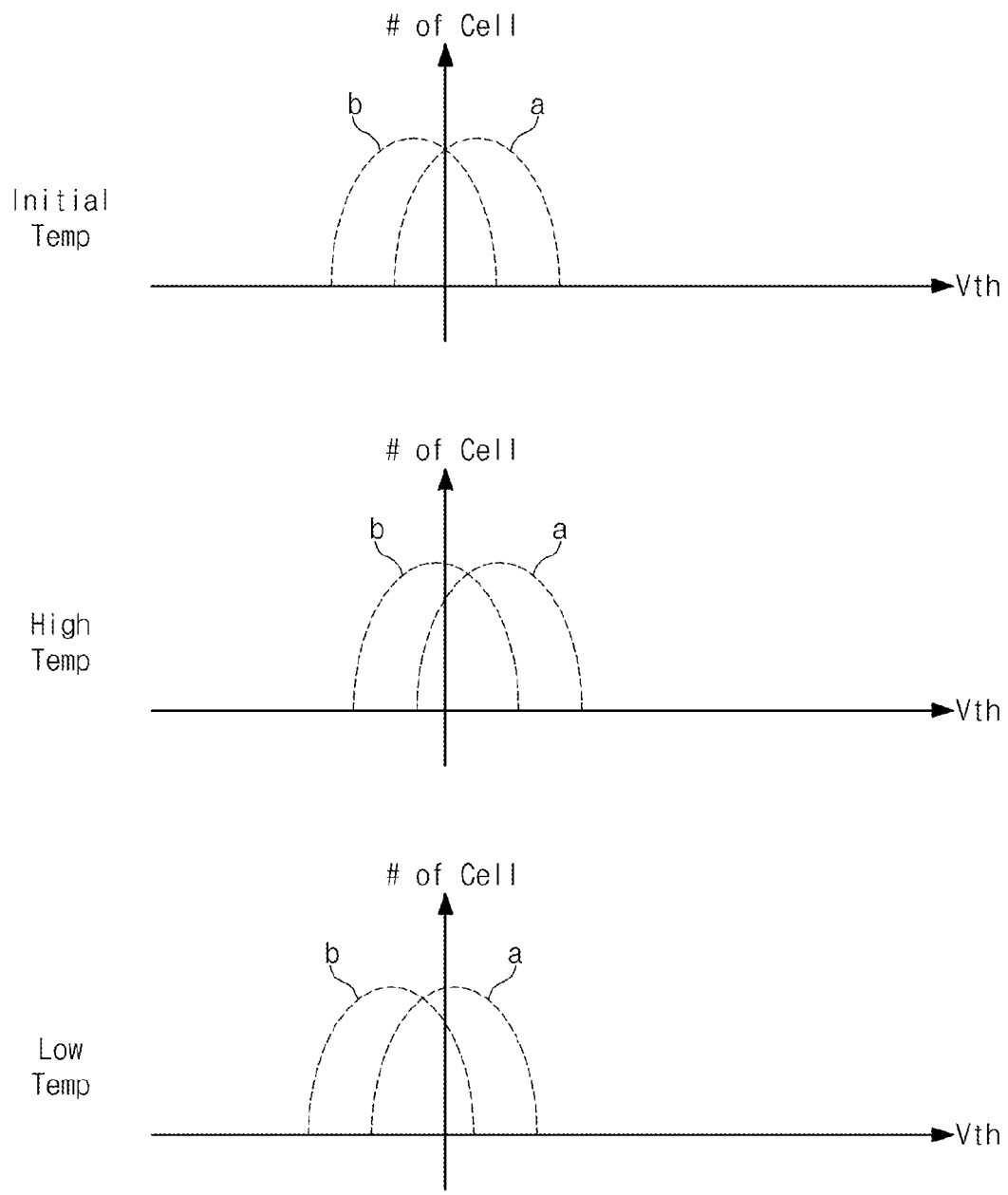
FIG. 9 is a diagram for describing an operation of control logic of FIG. 8, according to an embodiment of the inventive concept.

FIG. 8 is a block diagram schematically illustrating a nonvolatile memory device, according to another embodiment of the inventive concept. FIG. 9 is a diagram for describing an operation of control logic of FIG. 8, according to an embodiment of the inventive concept.

Referring to FIG. 8, a nonvolatile memory device 220 according to another embodiment of the inventive concept includes a memory cell array 221, control logic 222, a row decoder 223, a page buffer circuit 224, an input/output buffer 225, and a temperature detecting unit 226. The memory cell array 221, the control logic 222, the row decoder 223, the page buffer circuit 224, and the input/output buffer 225 may be configured substantially the same as the memory cell array 121, the control logic 122, the row decoder 123, the page buffer circuit 124, and the input/output buffer 125 described with reference to FIG. 2.

The temperature detecting unit 226 detects internal and/or external temperature of the nonvolatile memory device 220, and sends the detected temperature information to the control logic 222. The control logic 222 may then control a first reference value a (refer to FIG. 3) and a second reference value b (refer to FIG. 3) based on the temperature information.

For example, when the detected temperature is greater than a reference temperature, the control logic 222 may decrease the first reference value a and the second reference value b. When the detected temperature is less than a reference temperature, the control logic 222 may increase the first reference value a and the second reference value b. This compensates for variation in threshold voltages of memory cells due to the influence of temperature. Generally, threshold voltage distributions of memory cells widen in response to increases in internal and/or external temperature of the nonvolatile memory device 220.

Figure 10:
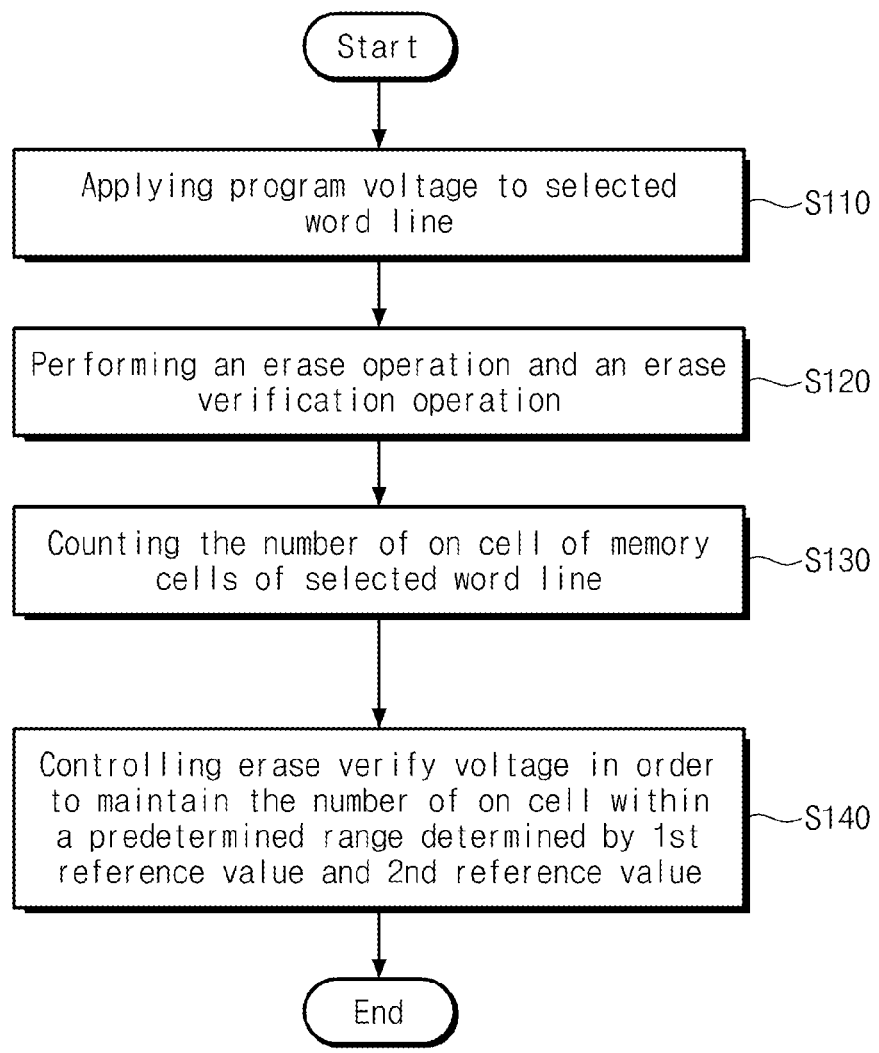
FIGS. 10 and 11 are flowcharts illustrating an operating method of a nonvolatile memory device, according to an embodiment of the inventive concept.
Figure 11:
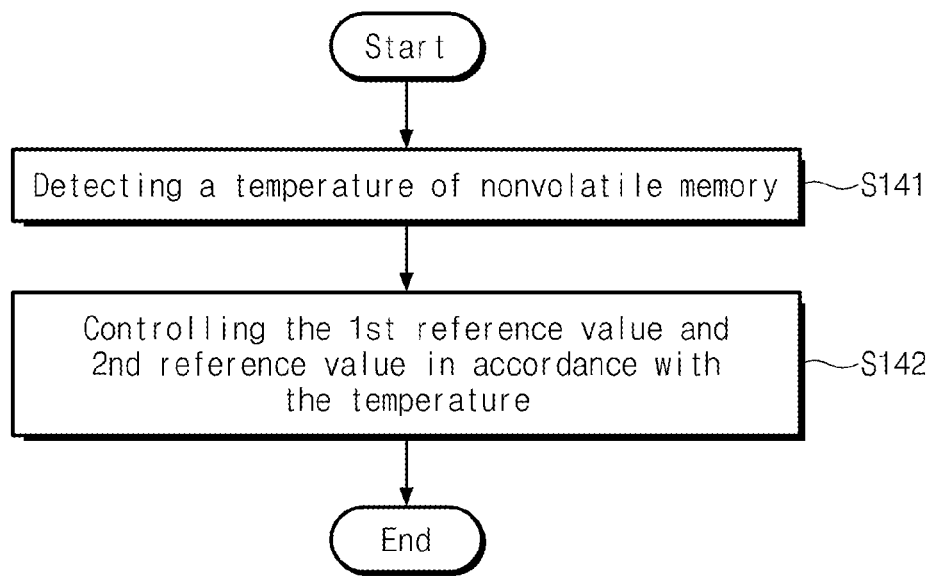

FIGS. 10 and 11 are flowcharts illustrating an operating method of a nonvolatile memory device, according to an embodiment of the inventive concept.

Referring to FIG. 10, an operating method of a nonvolatile memory device according to an embodiment of the inventive concept includes applying a program voltage to a selected word line for programming memory cells connected to the selected word line (S110), performing an erase operation and an erase verify operation (S120), applying a read voltage to the selected word line to determine (count) the number of on-cells (S130), and controlling an erase verification voltage such that the number of on-cells determined is maintained within a predetermined range defined by a first reference value and a second reference value (S140).

In operation S140, the level of the erase verification voltage may be decreased when the number of on-cells is determined to be less than the first reference value. The level of the erase verification voltage may be increased when the number of on-cells is determined to be more than the second reference value. A threshold voltage distribution of erased memory cells may be formed between a threshold voltage distribution having the first reference value and a threshold voltage distribution having the second reference value. Thus, the reliability of the nonvolatile memory device may be maintained at a constant level, which improves reliability.

Referring to FIG. 11, in the depicted illustrative embodiment, operation S140 includes operations of measuring a temperature of the nonvolatile memory device (S141), and controlling the first reference value and the second reference value according to the measured temperature (S142). The operations S141 and S142 may be performed to compensate for variations in threshold voltages of memory cells due to the influence of temperature. The reason is that threshold voltage distributions of memory cells generally widen according to an increase in internal and/or external temperature of the nonvolatile memory device 220, for example.

Figure 12:
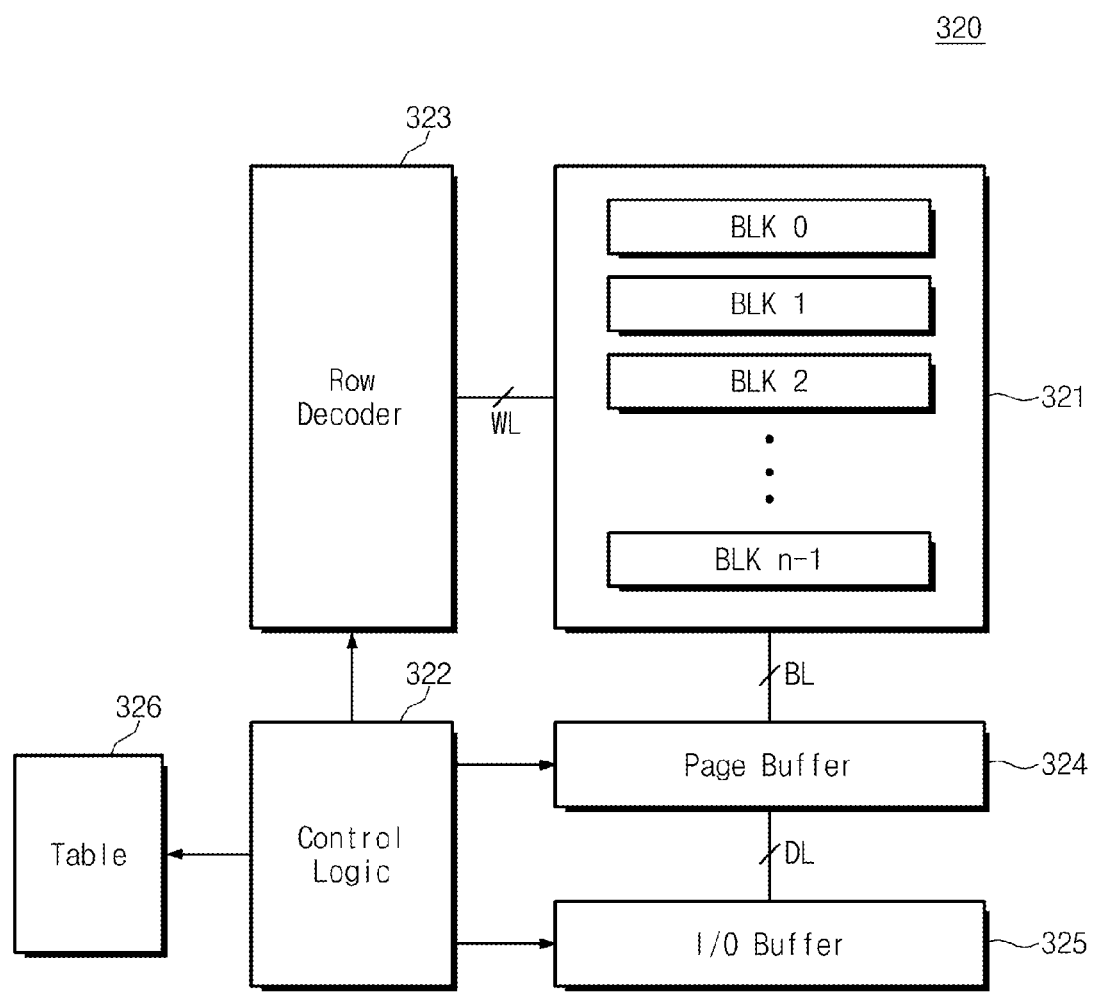
FIG. 12 is a block diagram schematically illustrating a nonvolatile memory device, according to still another embodiment of the inventive concept.

FIG. 12 is a block diagram schematically illustrating a nonvolatile memory device, according to another embodiment of the inventive concept. FIG. 13 is a table for describing operation of the nonvolatile memory device of FIG. 12, according to an embodiment of the inventive concept.

Referring to FIG. 12, a nonvolatile memory device 320 according to another embodiment of the inventive concept includes a memory cell array 321, control logic 322, a row decoder 323, a page buffer circuit 324, an input/output buffer 325, and a table 326. The memory cell array 321, the control logic 322, the row decoder 323, the page buffer circuit 324, and the input/output buffer 325 may be configured substantially the same as the memory cell array 121, the control logic 122, the row decoder 123, the page buffer circuit 124, and the input/output buffer 125 described with reference to FIG. 2.

The table 326 stores the number of program and erase operations (PE cycles) and level information of the erase verification voltage corresponding to the number of program and erase operations. Referring to FIG. 13, a P/E cycle includes the number of program erase operations. An erase verify level indicates the level of the erase verification voltage according to a P/E cycle. The number of P/E cycles and the level of the corresponding erase verification voltage in FIG. 13 are illustrative. In the example depicted in FIG. 12, the table 326 is included in the nonvolatile memory device 320. However, embodiments of the inventive concept are not limited thereto. For example, the table 325 may be included in the memory controller 110 (refer to FIG. 1), without departing from the spirit and scope of the present teachings.

The control logic 322 may control the level of an erase verification voltage Vevfy based on the table 326. For example, the control logic 322 may count the P/E cycle. If the counted P/E cycle value is equal to a P/E cycle value stored at the table 322, the control logic 322 applies the corresponding level of the erase verification voltage Vevfy, and changes the level of the erase verification voltage Vevfy to the level of the erase verification voltage Vevfy stored in the table 326 from a next P/E cycle when appropriate.

For example, in accordance with the illustrative table 326 in FIG. 13, the control logic 322 increases the levels of the erase verification voltage Vevfy until a predetermined P/E cycle (e.g., 100K (K being 1000)), and then decreases the levels of the erase verification voltage Vevfy. The predetermined P/E cycle may be the P/E cycle that makes the number of on-cells become larger than a second reference value b, as described with reference to FIG. 3.

As described with reference to FIG. 1, the nonvolatile memory device 320 of FIG. 12 may iteratively perform program and erase operations, which constitute a cycle. As program and erase operations are iterated, electrons may be trapped in a memory cell. This may cause an increase in a threshold voltage of the memory cell. In the event that an erase operation is performed using a constant erase verification voltage, the number of fail bits indicating that data is not erased may increase, deteriorating reliability.

The control logic 322 of the nonvolatile memory device 320 may control an erase verification voltage Vevfy according to a P/E cycle value based on the table 326, so that the number of fail bits is reduced. This improves the reliability of the nonvolatile memory device 320.

Figure 14:
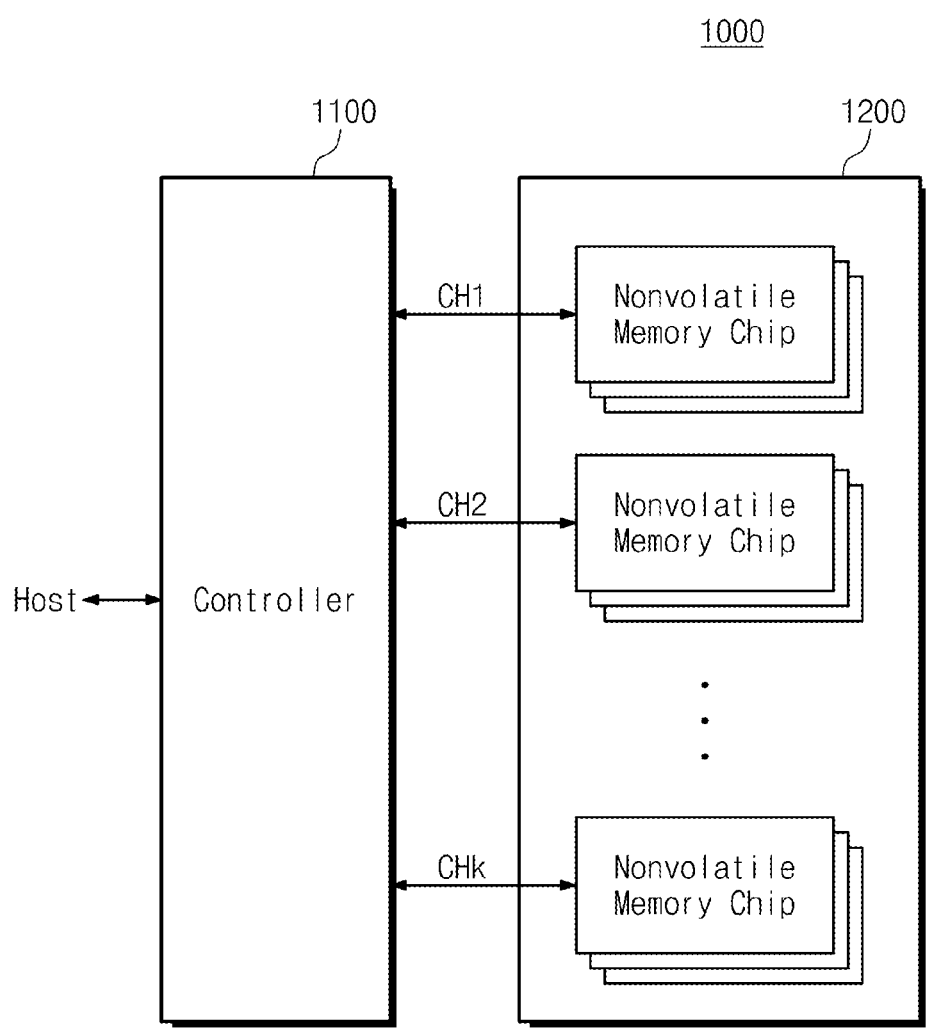
FIG. 14 is a block diagram schematically illustrating an application of a memory system of FIG. 1, according to an embodiment of the inventive concept.

FIG. 14 is a block diagram schematically illustrating an application of a memory system of FIG. 1, according to an embodiment of the inventive concept.

Referring to FIG. 14, a memory system 1000 includes a controller 1100 and a nonvolatile memory device 1200. The nonvolatile memory device 1200 includes a plurality of nonvolatile memory chips, which are divided into groups. The nonvolatile memory chips in each group communicate with the controller 1100 through a common channel CH1, CH2, . . . CHk. In the example shown in FIG. 14, the nonvolatile memory chips communicate with the controller 1100 through a plurality of channels CH1 to CHk. Each nonvolatile memory chip may be formed of a nonvolatile memory device 120, 220 and 320, as described with reference to FIGS. 1, 2, 8 and 12, for example. The controller 1100 may be formed of a memory controller 110 described with reference to FIG. 1.

Figure 15:
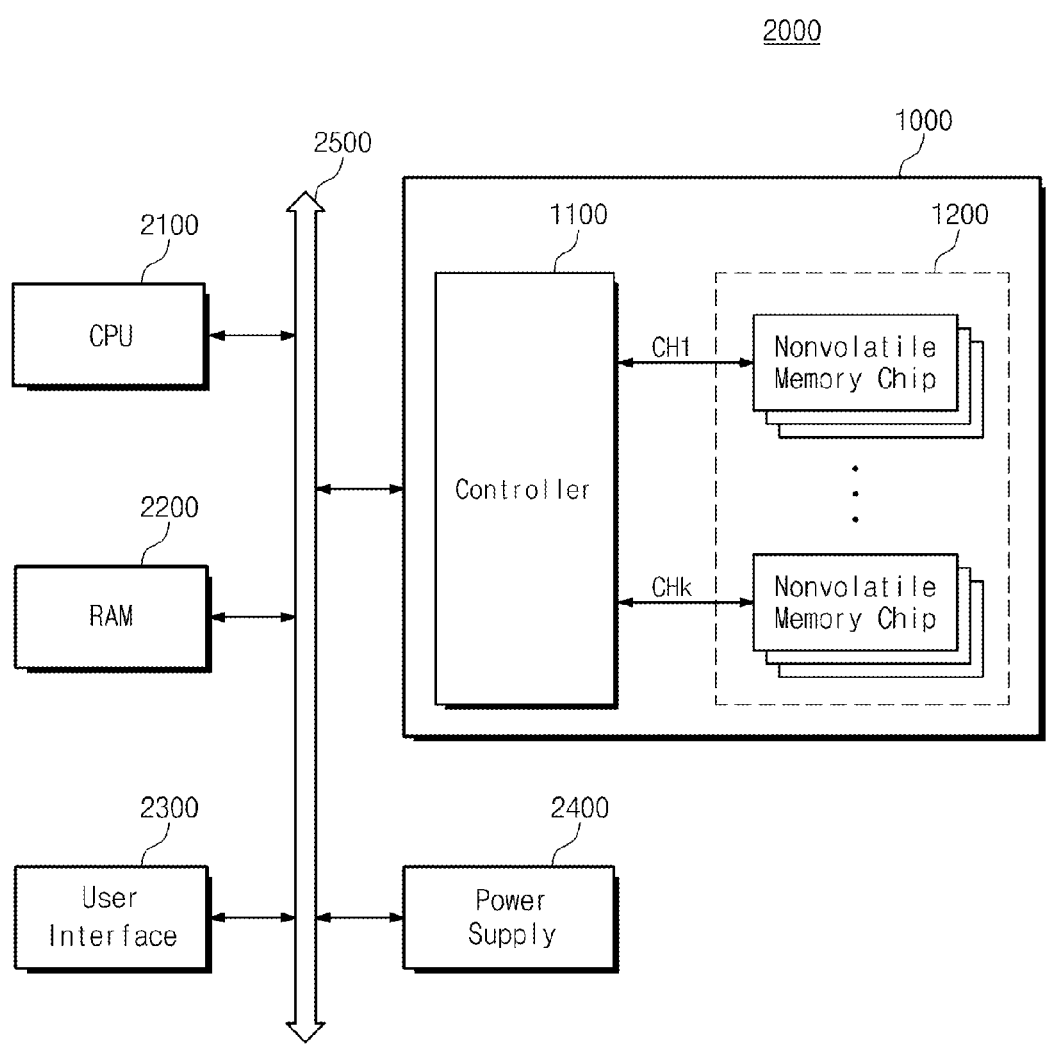
FIG. 15 is a block diagram schematically illustrating a computing system including a memory system of FIG. 14, according to an embodiment of the inventive concept.

FIG. 15 is a block diagram schematically illustrating a computing system including a memory system of FIG. 14, according to an embodiment of the inventive concept.

Referring to FIG. 15, a computing system 2000 include a central processing unit (CPU) 2100, a RAM 2200, a user interface 2300, a power supply 2400, and a memory system 1000. The memory system 1000 may be electrically connected to the CPU 2100, the RAM 2200, the user interface 2300 and the power supply 2400 through a system bus 2500. Data provided through the user interface 2300 or processed by the CPU 2100 may be stored at the memory system 1000. The memory system 1000 includes a controller 1100 and a nonvolatile memory device 1200.

In the example shown in FIG. 15, the nonvolatile memory device 120 is connected to the system bus 2500 through the controller 1100. However, embodiments of the inventive concept are not limited thereto. For example, the nonvolatile memory device 1200 may be directly connected to the system bus 2500. In this case, one or more functions of the controller 1100 described with reference to FIG. 14 may be executed by the CPU 2100.

In FIG. 15, the memory system 1000 described with reference to FIG. 14 may be replaced with that the memory system 100 described with reference to FIG. 1. For example, the computing system 2000 may be configured to include memory systems 100 and 1000 described with reference to FIGS. 1 and 14. Likewise, the respective nonvolatile memories may be formed of the nonvolatile memory device 120, 220 and 320, as described with reference to FIGS. 1, 2, 8 and 12, for example.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
   a memory cell array including a plurality of memory blocks, each memory block of the plurality of memory blocks comprising memory cells connected to word lines and bit lines; and
   control logic configured to perform an erase operation in which an erase voltage is applied to a memory block of the plurality of memory blocks to erase the memory cells of the memory block, and in which an erase verification voltage is applied a selected word line of the memory block to verify respective erase states of memory cells connected to the selected word line,
   wherein the control logic is further configured to apply a read voltage to the selected word line to extract erase state information of the memory cells, and to control a level of the erase verification voltage based on the erase state information, wherein the erase state information indicates the number of on-cells or off-cells of the memory cells connected to the selected word line, wherein the control logic is further configured to decrease the level of the erase verification voltage when the number of on-cells is less than a first reference value, wherein the control logic is further configured to increase the level of the erase verification voltage when the number of on-cells is more than a second reference value, the second reference value being larger than the first reference value, and wherein the control logic is further configured to control the first reference value and the second reference value according to at least one of a measured temperature and a number of erase operations executed.

2. The nonvolatile memory device of claim 1, wherein the control logic is further configured to decrease the first reference value and the second reference value when the measured temperature is greater than a reference temperature, and to increase the first reference value and the second reference value when the measured temperature is less than the reference temperature.

3. The nonvolatile memory device of claim 1, wherein the control logic is further configured to decrease the first reference value and the second reference value when the number of erase operations executed increases.

4. The nonvolatile memory device of claim 1, wherein the erase voltage includes an initial erase voltage and an erase voltage increment, and wherein the control logic is further configured to control a level of the initial erase voltage and a level of the erase voltage increment.

5. The nonvolatile memory device of claim 4, wherein the control logic is further configured to control the level of the initial erase voltage according to a variation in the level of the erase verification voltage.

6. The nonvolatile memory device of claim 4, wherein the control logic is further configured to control the level of the erase voltage increment based on the erase state information.

7. A method of operating a nonvolatile memory device, comprising:

performing an erase operation in which an erase voltage is applied to a memory block to erase memory cells and an erase verification voltage is applied to a selected word line to verify an erase state of memory cells connected to the selected word line;

applying a read voltage to the selected word line to determine the number of on-cells; and controlling a level of the erase verification voltage such that the number of on-cells is maintained within a range defined by a first reference value and a second reference value.

8. The method of claim 7, wherein the level of the erase verification voltage is decreased when the number of on-cells is less than the first reference value, and is increased when the number of on-cells is more than the second reference value, the second reference value being larger than the first reference value.

9. The method of claim 7, further comprising:
controlling a level of the erase voltage based on the level of the erase verification voltage.

10. The method of claim 7, wherein the erase voltage includes an initial erase voltage and an erase voltage increment, the method further comprising:
controlling a level of the initial erase voltage and a level of the erase voltage increment.

11. The method of claim 7, wherein controlling the level of the erase verification voltage comprises:
measuring a temperature of the nonvolatile memory device; and
controlling the first reference value and the second reference value according to the measured temperature.

12. The method of claim 11, wherein the first reference value and the second reference value decrease when the measured temperature is greater than a reference temperature and increase when the measured temperature is less than the reference temperature.

13. The method of claim 7, wherein controlling the level of the erase verification voltage comprises:
controlling the first reference value and the second reference value according to the number of program and erase operations executed, the first reference value and the second reference value decreasing according to an increase in the number of program and erase operations executed.

14. A nonvolatile memory device, comprising:
a memory cell array including a plurality of memory blocks, each memory block of the plurality of memory blocks comprising memory cells connected to word lines and bit lines;
control logic configured to perform an erase operation in which an erase voltage is applied to a memory block of the plurality of memory blocks to erase the corresponding memory cells, and an erase verification voltage is applied a selected word line of the memory block to verify erase state of the memory cells connected to the selected word line; and
a table configured to store information indicating the number of program and erase operations and information indicating a level of the erase verification voltage corresponding to the information indicating the number of program and erase operations,
wherein the control logic is further configured to control the level of the erase verification voltage based on the table.

15. The nonvolatile memory device of claim 14, wherein the control logic is further configured to increase the levels of the erase verification voltage until a predetermined number of program and erase operations, and then to decrease the level of the erase verification voltage after the predetermined number of program and erase operations.

* * * * *